(12) United States Patent
Ershov

(10) Patent No.: US 11,474,440 B2
(45) Date of Patent: Oct. 18, 2022

(54) METHOD OF AND APPARATUS FOR IN-SITU REPAIR OF REFLECTIVE OPTIC

(71) Applicant: ASML Netherlands B.V., Veldhoven (NL)

(72) Inventor: Alexander I. Ershov, Escondido, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/081,492

(22) Filed: Oct. 27, 2020

(65) Prior Publication Data

US 2021/0055665 A1  Feb. 25, 2021

Related U.S. Application Data

(63) Continuation of application No. 14/964,319, filed on Dec. 9, 2015, now abandoned, which is a continuation of application No. 13/650,778, filed on Oct. 12, 2012, now abandoned.

(51) Int. Cl.
*G03F 7/00* (2006.01)
*G03F 7/20* (2006.01)

(52) U.S. Cl.
CPC ...... *G03F 7/70925* (2013.01); *G03F 7/70216* (2013.01); *G03F 7/70975* (2013.01)

(58) Field of Classification Search
CPC ............. G03F 7/70216; G03F 7/70925; G03F 7/70975
USPC ............... 430/5; 204/192.32, 192.34, 192.35
See application file for complete search history.

(56) References Cited

U.S. PATENT DOCUMENTS

| | | |
|---|---|---|
| 3,021,271 A | 2/1962 | Wehner |
| 4,128,765 A | 12/1978 | Franks |
| 4,758,304 A | 7/1988 | McNeil et al. |
| 5,551,587 A | 9/1996 | Keppel et al. |
| 6,967,168 B2 | 11/2005 | Stearns et al. |
| 7,062,348 B1 | 6/2006 | Folia |
| 2003/0006214 A1 | 1/2003 | Stearns et al. |
| 2003/0228529 A1 | 12/2003 | Dieu et al. |
| 2004/0175633 A1 | 9/2004 | Shoki et al. |
| 2007/0187627 A1 | 8/2007 | Ershov et al. |
| 2011/0189593 A1 | 8/2011 | Ogawa et al. |
| 2011/0233401 A1 | 9/2011 | Nishinaka et al. |
| 2012/0223256 A1 | 9/2012 | Bykanov et al. |
| 2012/0250144 A1 | 10/2012 | Ehm et al. |

OTHER PUBLICATIONS

International Search Report and Written Opinion, International Application No. PCT/US2013/062026, dated Feb. 26, 2014.

*Primary Examiner* — Rodney G McDonald
(74) *Attorney, Agent, or Firm* — DiBerardino McGovern IP Group LLC

(57) ABSTRACT

Method of and apparatus for repairing an optical element disposed in a vacuum chamber while the optical element is in the vacuum chamber. An exposed surface of the optical element is exposed to an ion flux generated by an ion source to remove at least some areas of the surface that have been damaged by exposure to the environment within the vacuum chamber. The method and apparatus are especially applicable to repair multilayer mirrors serving as collectors in systems for generating EUV light for use in semiconductor photolithography.

14 Claims, 4 Drawing Sheets

METHOD OF AND APPARATUS FOR IN-SITU REPAIR OF REFLECTIVE OPTIC

CROSS-REFERENCE TO RELATED APPLICATIONS

This application is a continuation of U.S. application Ser. No. 14/964,319 filed on Dec. 9, 2015, which is a continuation of U.S. application Ser. No. 13/650,778 filed on Oct. 12, 2012, each of which is incorporated by reference in its entirety herein.

FIELD

The present disclosure relates to optical elements designed to operate in environments in which they are subject to contamination and wear. An example of such an environment is the vacuum chamber of an apparatus for generating extreme ultraviolet ("EUV") radiation from a plasma created through discharge or laser ablation of a source material. In this application, the optical elements are used, for example, to collect and direct the radiation for utilization outside of the vacuum chamber, e.g., for semiconductor photolithography.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates such as silicon wafers.

Methods for generating EUV light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

One LPP technique involves generating a stream of target material droplets and irradiating at least some of the droplets with laser light pulses. In more theoretical terms, LPP light sources generate EUV radiation by depositing laser energy into a target material having at least one EUV emitting element, such as xenon (Xe), tin (Sn), or lithium (Li), creating a highly ionized plasma with electron temperatures of several 10's of eV.

The energetic radiation generated during de-excitation and recombination of these ions is emitted from the plasma in all directions. In one common arrangement, a near-normal-incidence mirror (often termed a "collector mirror" or simply a "collector") is positioned to collect, direct (and in some arrangements, focus) the light to an intermediate location. The collected light may then be relayed from the intermediate location to a set of scanner optics and ultimately to a wafer.

In the EUV portion of the spectrum it is generally regarded as necessary to use reflective optics for the collector. At the wavelengths involved, the collector is advantageously implemented as a multi-layer mirror ("MLM"). As its name implies, this MLM is generally made up of alternating layers of material over a foundation or substrate.

The optical element must be placed within the vacuum chamber with the plasma to collect and redirect the EUV light. The environment within the chamber is inimical to the optical element and so limits its useful lifetime, for example, by degrading its reflectivity. An optical element within the environment may be exposed to high energy ions or particles of source material. The particles of source material can contaminate the optical element's exposed surface. Particles of source material can also cause physical damage and localized heating of the MLM surface. The source materials may be particularly reactive with a material making up at least one layer of the MLM, e.g., molybdenum and silicon. Temperature stability, ion-implantation and diffusion problems may need to be addressed even with less reactive source materials, e.g., tin, indium, or xenon.

There are techniques which may be employed to increase optical element lifetime despite these harsh conditions. For example, protective layers or intermediate diffusion barrier layers may be used to isolate the MLM layers from the environment. The collector may be heated to an elevated temperature of, e.g., up to 500° C., to evaporate debris from its surface. The collector surface may be cleaned using hydrogen radicals. An etchant may be employed e.g., a halogen etchant, to etch debris from the collector surfaces and create a shielding plasma in the vicinity of the reflector surfaces. These latter two techniques can remove contaminating source material from the collector surface, but they are generally ineffective to remove damaged original collector material from the surface of the collector. There remains a need to extend collector lifetime by cleaning the collector surface and removing damaged collector material from the collector surface, all preferably without having to remove the collector from its operating environment. With this in mind, applicant discloses arrangements for in-situ cleaning and repair of the surfaces of optical elements.

SUMMARY

The following presents a simplified summary of on e or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, the invention is a method of repairing an optical element disposed in a vacuum chamber comprising the steps of cleaning an exposed surface of the optical element while the optical element is in the vacuum chamber to remove at least some of a contaminant on the exposed surface to produce a cleaned exposed surface, and exposing the cleaned exposed surface while the optical element is in the vacuum chamber to an ion flux generated by an ion gun to remove at least some areas of the surface that have been damaged by exposure to the environment within the vacuum chamber. The cleaning step may be performed by subjecting the exposed surface to hydrogen radicals and may remove substantially all of the contaminant from the exposed surface.

The exposing step may remove substantially all areas of the surface that have been damaged by exposure to the environment within the vacuum chamber. The exposing step may comprise the additional steps of generating the ion flux using an ion gun and directing the ion gun to cause ions to strike at least some areas of the surface that have been damaged by exposure to the environment within the vacuum chamber, or all of the surface.

Another aspect of the invention is a method of repairing a multilayer mirror in a system for producing EUV light for semiconductor photolithography, the multilayer mirror being disposed in a vacuum chamber in which a source material is vaporized to produce the EUV light, comprising the steps of cleaning an exposed surface of the multilayer mirror while the multilayer mirror is in the vacuum chamber to remove at least some source material on the exposed surface to produce a cleaned exposed surface and exposing the cleaned exposed surface while the multilayer mirror is in the vacuum chamber to an ion flux to remove at least some areas of the surface that have been damaged by exposure to the environment within the vacuum chamber.

Yet another aspect of the invention is an apparatus comprising a vacuum chamber, an optical element disposed within the vacuum chamber, an ion source disposed within the vacuum chamber, and an actuator mechanically coupled to the ion source and arranged to aim the ion source toward at least a portion of the exposed surface of the optical element in response to a control signal.

Still another aspect of the invention is apparatus for producing EUV light for semiconductor photolithography, the apparatus comprising a vacuum chamber in which a source material is vaporized to produce the EUV light, a multilayer mirror disposed in the vacuum chamber, an ion source disposed within the vacuum chamber, and an actuator mechanically coupled to the ion source and arranged to aim the ion source toward at least a portion of the exposed surface of the optical element in response to a control signal.

DETAILED DESCRIPTION

Figure 1:
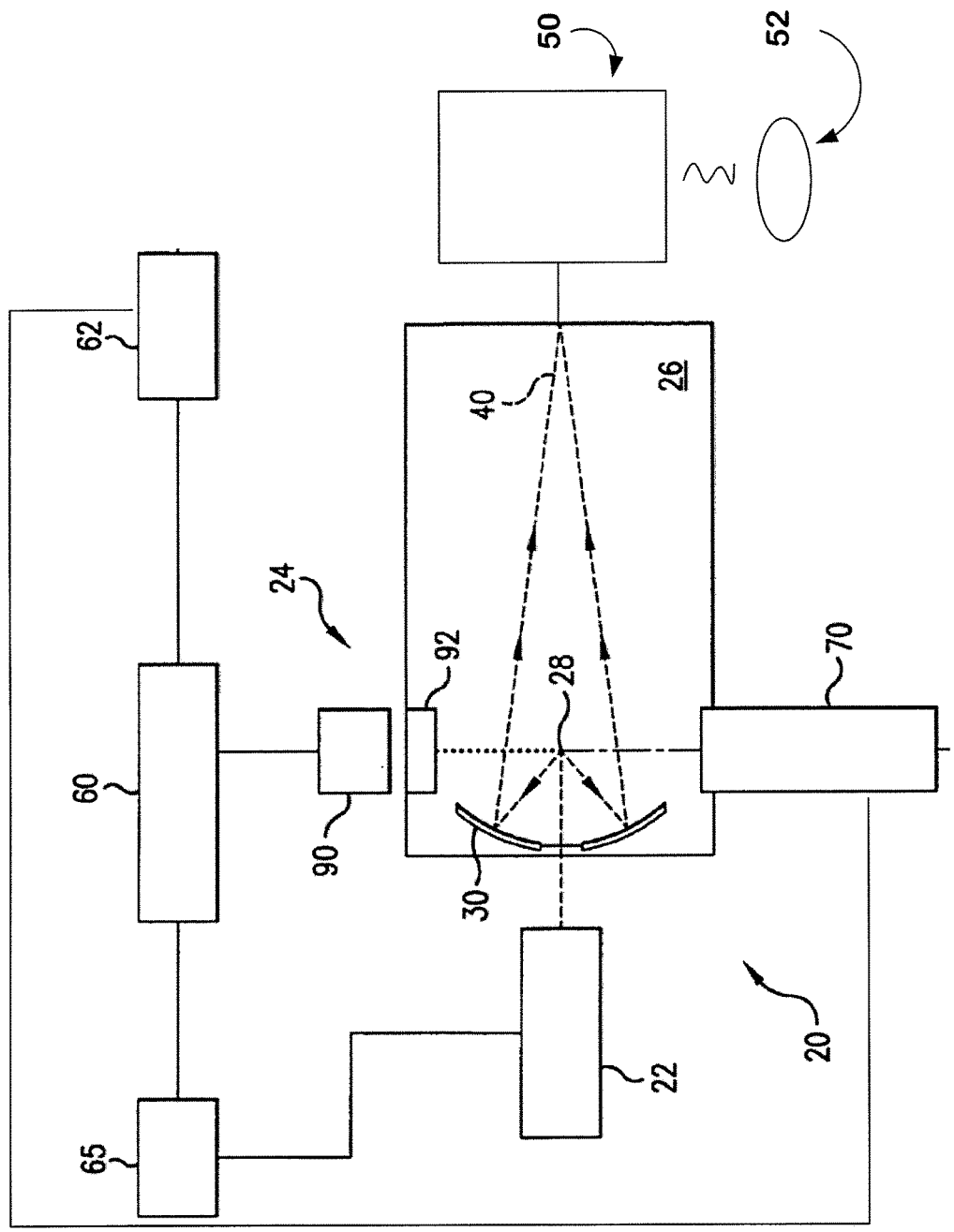
FIG. 1 shows a schematic, not to scale, view of an overall broad conception for a laser-produced plasma EUV light source system according to an aspect of the present invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

With initial reference to FIG. 1 there is shown a schematic view of an exemplary EUV light source, e.g., a laser produced plasma EUV light source 20 according to one aspect of an embodiment of the present invention. As shown, the EUV light source 20 may include a pulsed or continuous laser source 22, which may for example be a pulsed gas discharge $CO_2$ laser source producing radiation at 10.6 μm. The pulsed gas discharge $CO_2$ laser source may have DC or RF excitation operating at high power and high pulse repetition rate.

The EUV light source 20 also includes a target delivery system 24 for delivering target material in the form of liquid droplets or a continuous liquid stream. The target material may be made up of tin or a tin compound, although other materials could be used. The target delivery system 24 introduces the target material into the interior of a chamber 26 to an irradiation region 28 where the target material may be irradiated to produce plasma. In some cases, an electrical charge is placed on the target material to permit the target material to be steered toward or away from the irradiation region 28. It should be noted that as used herein an irradiation region is a region where target material irradiation may occur, and is an irradiation region even at times when no irradiation is actually occurring.

Continuing with FIG. 1, the light source 20 may also include one or more optical elements such as a collector 30. The collector 30 may be a normal incidence reflector, for example, implemented as an MLM, that is, a SiC substrate coated with a Mo/Si multilayer with additional thin barrier layers deposited at each interface to effectively block thermally-induced interlayer diffusion. Other substrate materials, such as Al or Si, can also be used. The collector 30 may be in the form of a prolate ellipsoid, with an aperture to allow the laser light to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV light may be output from the EUV light source 20 and input to, e.g., an integrated circuit lithography tool 50 which uses the light, for example, to process a silicon wafer workpiece 52 in a known manner. The silicon wafer workpiece 52 is then additionally processed in a known manner to obtain an integrated circuit device.

Figure 2:
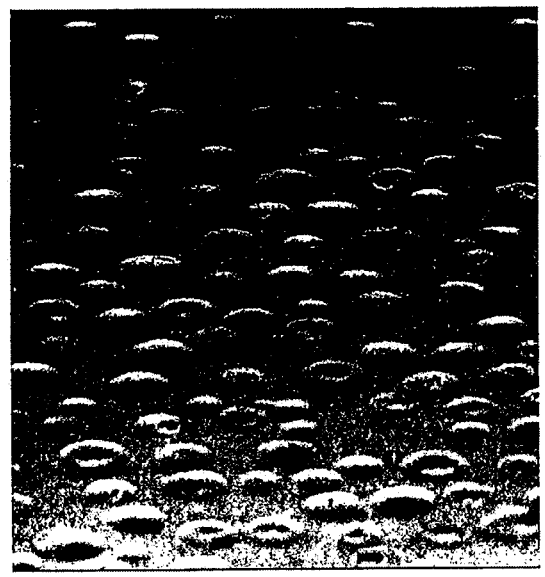
FIG. 2 is a scanning electron microscope photograph of the collector surface damage.
Figure 3:
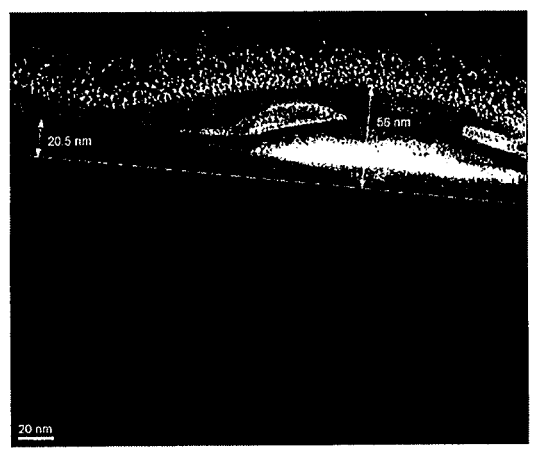
FIG. 3 is transmission electron microscope photograph of collector surface damage.

As described above, one of the technical challenges in the design of an optical element such as the collector 30 is extending its lifetime. The surface of the collector, which is usually a coating, becomes contaminated with source material, e.g., tin. In-situ cleaning using hydrogen radicals in a known manner can be used to remove this contamination from the collector surface. In-situ collector cleaning is very desirable because it dramatically reduces both tool downtime and the expense of collector replacement. Hydrogen radical-based cleaning does not, however, repair damage to the collector surface. This type of damage can be quite severe, as can be seen in FIGS. 2 and 3, which are a scanning electron microscope photograph and a transmission electron microscope photograph, respectively, of collector surface damage.

Thus, the surface damage of the collector coating is still present after cleaning has been performed. This surface damage can lead to accelerated degradation of collector reflectivity after the cleaning. In order to improve collector lifetime after cleaning so that reflectivity approaches that of a new collector, the collector surface damage needs to be repaired in-situ. As used herein, "repair" and its cognates refer to removing some or all of the collector material that has been damaged by exposure to the conditions in the chamber environment.

Figure 4:
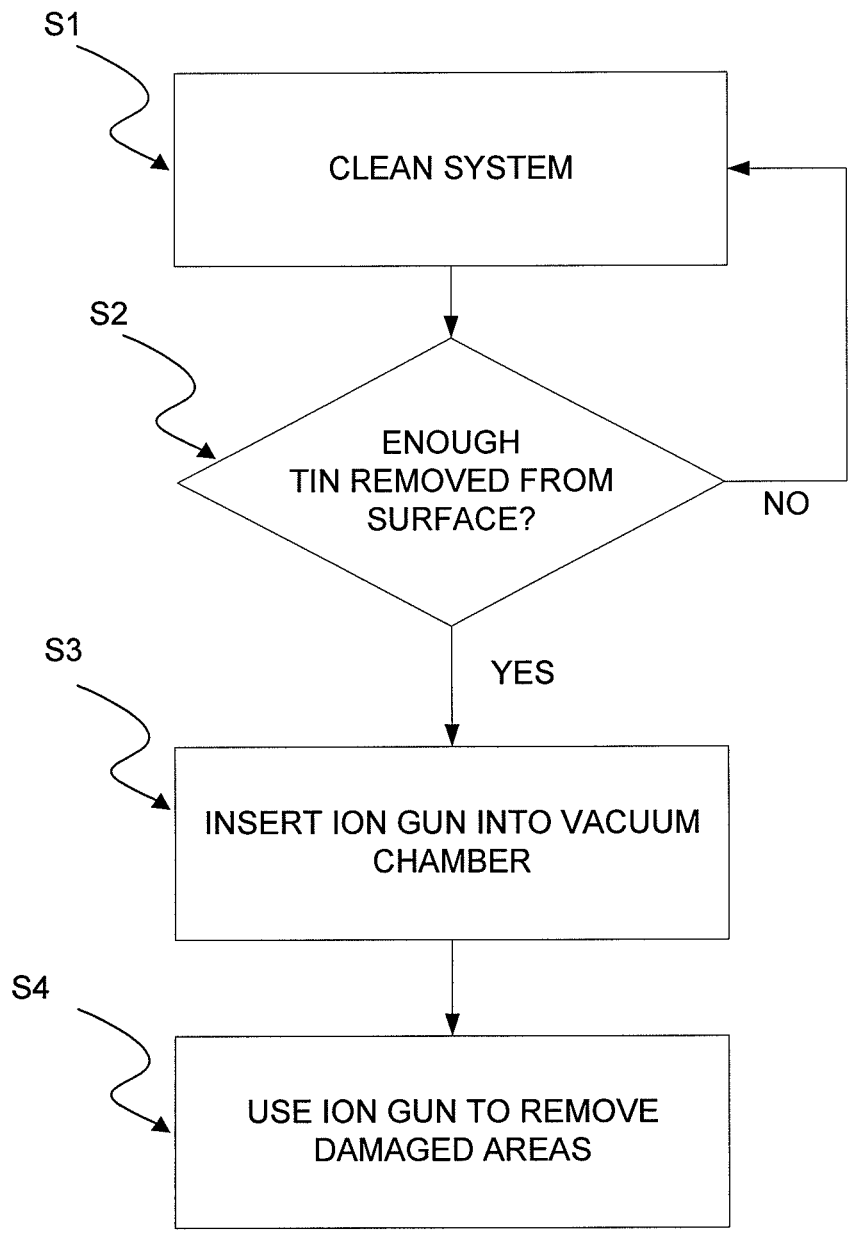
FIG. 4 is flow chart showing the steps of a process for cleaning and repairing the collector 30 of FIG. 1.

To achieve this end, in one embodiment, the present invention is a method of in-situ cleaning and repairing of a collector surface. The method will now be described in conjunction with FIG. 4, which is a flowchart of one embodiment of the method. In the method shown in FIG. 4 a specific source material, tin, is referenced, but it will be understood by one of ordinary skill in the art that the method is equally applicable to systems in which another type of source material is used.

In a first step S1 the system is cleaned using a prior art hydrogen radical-based technique or any other suitable technique. The cleaning step S1 is carried out until it is determined in step S2 that a predetermined amount, e.g., preferably substantially all, of the tin has been removed. The determination on whether enough tin has been removed can be made using any desirable method. For example, the completion of step S1 can be determined by measurement, for example, by measuring the amount of residual tin, or simply continuing to perform step S1 for an amount of time that has been determined to be sufficient to remove enough of the tin residue.

Figure 5:
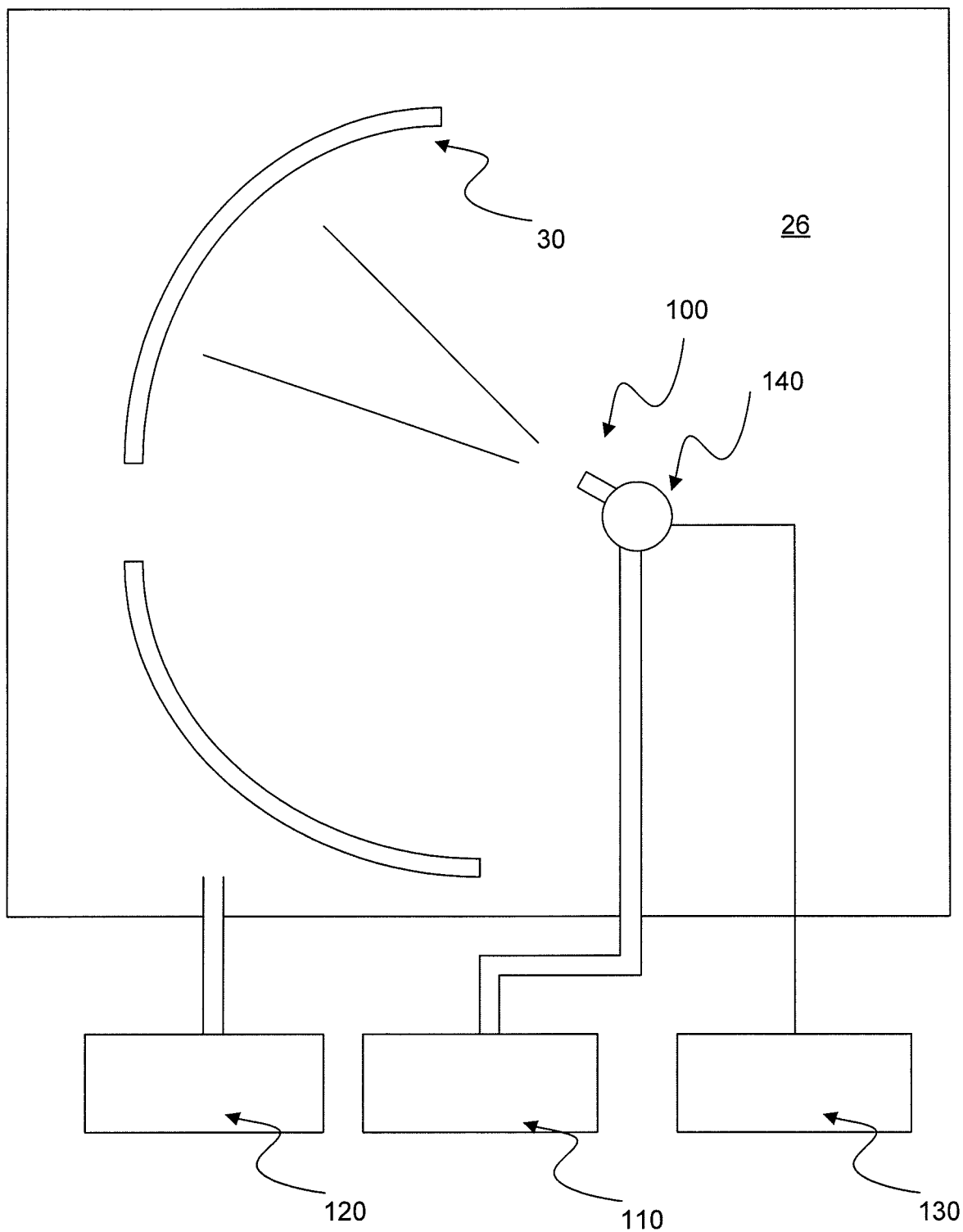
FIG. 5.1 is a schematic of one embodiment of an arrangement for repair of the collector 30 of FIG. 1.

Once it is determined in step S2 that enough of the tin has been removed from the collector surface, an ion source or gun such as ion gun 100 as shown in FIG. 5 is introduced into the vacuum chamber 26 in step S3. As used herein, "ion source" or "ion gun" means a device specifically adapted to produce ions predominantly in a given direction without the production of contaminant particles, and specifically excludes devices or arrangements that produce ions ancillary to some other process such as the production of EUV light. In step S4 the ion gun repairs the collector surface by removing some or all of the damaged areas of the surface of collector 30. Ion gun 100 accomplishes this by generating a flux of ions towards the surface of collector 30. The energy of the ions is selected to provide effective sputtering of the surface (typically 200-1000 V). Because the damage to the surface of collector 30 is localized to just beneath the surface, that is, in the first 50 nm or so, the ion bombardment will remove all the damaged area and leave the undamaged inner layers of the collector 30.

As shown in FIG. 5, the ion gun 100 is arranged in fluid communication with a source of process gas 110, which process gas can be Ar or any other suitable gas, such as Kr or He. The flow of process gas into the ion gun 100 could be in the range of 0.1-10 slm.

The vacuum chamber 26 is maintained at vacuum using a pump 120, which is preferably a high-throughput turbomolecular pump (>500 L/sec pumping speed).

The ion gun 100 can be positioned near the primary focus of the collector 30 and pointed towards the collector surface. It creates a flux of ions towards the collector, with the cross-section size of the beam at the collector surface preferably in the range of 2-50 cm depending on the particular design of the ion gun 100. The ion beam can be scanned over the collector surface by aiming or tilting the ion gun 100 under the control of scanning control system 130. The scanning control system 130 can control the ion gun to repair the entire surface of the collector 30 or just the selected areas of the surface of collector 30. The scanning control system 130 accomplishes this by aiming the ion gun 100, for example, by tilting the head of ion gun 100 by controlling an actuator 140 that is mechanically coupled to the ion gun 100. As used herein, an actuator is any device for causing motion in response to a control signal. The scanning control system 130 may be implemented by any device that can generate control signals such as in response to user input or a control program, for example a processor suitably programmed in a manner that will be readily apparent to one having ordinary skill in the art.

The ion gun 100 bombards the selected areas of the surface of the collector 30 until a predetermined amount of the surface has been removed. This can be accomplished by measuring a parameter which depends on the amount of removed material, e.g., reflectivity. It can also be accomplished by bombarding the selected area of the surface with ions for an amount a time that has been determined to be sufficient to ensure removal of enough material.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method of repairing an optical element in a vacuum chamber in which EUV radiation has been generated, the method comprising:
    cleaning an exposed surface of the optical element while the optical element is in the vacuum chamber by subjecting the exposed surface to hydrogen radicals to remove at least some of a contaminant deposited on the exposed surface during EUV radiation generation, to produce a cleaned exposed surface; and
    subjecting the cleaned exposed surface while the optical element is in the vacuum chamber to an ion flux to remove at least some areas of the exposed surface of the optical element that have been damaged by deposition of the contaminant during EUV radiation generation by providing an ion gun and a mechanical actuator mechanically coupled to the ion gun, controlling the actuator to move the ion gun to direct the ion gun toward at least a portion of the cleaned exposed surface of the optical element, and controlling the ion gun to generate the ion flux.

2. A method as claimed in claim 1 wherein subjecting the cleaned exposed surface while the optical element is in the vacuum chamber to an ion flux comprises generating a beam of ions and wherein a cross-sectional size of the beam at the cleaned exposed surface is in the range of 2 cm to 50 cm.

3. A method as claimed in claim 1 wherein subjecting the cleaned exposed surface while the optical element is in the vacuum chamber to an ion flux comprises generating ions having an energy in a range between 200 volts and 1000 volts.

4. A method as claimed in claim 1 wherein subjecting the cleaned exposed surface while the optical element is in the vacuum chamber to an ion flux comprises generating and directing towards the at least some areas ions having an energy selected to cause sputtering of the cleaned exposed surface effective to remove the least some areas of the clean exposed surface.

5. A method as claimed in claim 1 wherein providing an ion gun and an actuator mechanically coupled to the ion gun comprises positioning the ion gun near a primary focus of the optical element.

6. A method of repairing a multilayer collector mirror in a system for producing EUV radiation for semiconductor photolithography, the multilayer collector mirror being disposed in a vacuum chamber in which a source material is used to produce the EUV radiation, the method comprising:
cleaning an exposed surface of the multilayer collector mirror while the multilayer collector mirror is in the vacuum chamber by subjecting the exposed surface to hydrogen radicals to remove at least some source material deposited on the exposed surface during production of the EUV radiation to produce a cleaned exposed surface; and
subjecting the cleaned exposed surface while the multilayer collector mirror is in the vacuum chamber to an ion flux to remove at least some areas of the exposed surface damaged by source material deposited on the exposed surface during production of the EUV radiation by providing an ion gun and a mechanical actuator mechanically coupled to the ion gun, controlling the actuator to move the ion gun to direct the ion gun toward at least a portion of the cleaned exposed surface of the optical element, and controlling the ion gun to generate the ion flux.

7. A method as claimed in claim 6 wherein subjecting the cleaned exposed surface to an ion flux comprises generating a beam and wherein a cross-section size of the beam at the exposed surface is in the range of 2 cm to 50 cm.

8. A method as claimed in claim 6 wherein subjecting the cleaned exposed surface to an ion flux comprises generating ions having an energy in a range between 200 volts and 1000 volts.

9. A method as claimed in claim 6 wherein subjecting the cleaned exposed surface to an ion flux comprises generating and directing towards the surface portion ions having an energy selected to cause sputtering of the cleaned exposed surface effective to remove the at least some areas.

10. A method as claimed in claim 6 wherein providing an ion gun and an actuator mechanically coupled to the ion gun comprises positioning the ion gun near a primary focus of the multilayer collector mirror.

11. A method as claimed in claim 6 wherein subjecting the cleaned exposed surface to an ion flux comprises the additional steps of:
generating the ion flux using an ion gun; and
directing the ion gun to cause ions to sequentially strike substantially all areas of the clean exposed surface that have been damaged by source material being deposited on the exposed surface during production of the EUV radiation.

12. A method of repairing a multilayer collector mirror in a system for producing EUV radiation for semiconductor photolithography, the multilayer collector mirror being disposed in a vacuum chamber containing an irradiation region at which an EUV target material has been irradiated to produce EUV radiation, the method comprising:
cleaning an exposed surface of the multilayer collector mirror while the multilayer collector mirror is in the vacuum chamber by subjecting the exposed surface to hydrogen radicals to remove at least some EUV target material, deposited when the EUV target material was irradiated to produce the EUV radiation, to produce a cleaned exposed surface; and
subjecting the cleaned exposed surface while the multilayer collector mirror is in the vacuum chamber to an ion flux to remove at least some areas of the surface of the multilayer collector mirror by providing an ion gun and a mechanical actuator mechanically coupled to the ion gun, controlling the actuator to move the ion gun to direct the ion gun toward at least a portion of the cleaned exposed surface of the optical element, and controlling the ion gun to generate the ion flux.

13. A method as claimed in claim 12 wherein subjecting the cleaned exposed surface while the multilayer collector mirror is in the vacuum chamber to an ion flux to remove at least some areas of the surface of the multilayer collector mirror comprises removing at least some areas of the multilayer collector mirror damaged by the EUV target material being deposited on the exposed surface of the multilayer collector mirror during production of the EUV radiation.

14. A method as claimed in claim 13 wherein providing an ion gun and an actuator mechanically coupled to the ion gun comprises positioning the ion gun near a primary focus of the multilayer collector mirror.

* * * * *